US011905596B2

(12) United States Patent
Yoshino et al.

(10) Patent No.: US 11,905,596 B2
(45) Date of Patent: Feb. 20, 2024

(54) METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Teruo Yoshino, Toyama (JP); Takeshi Yasui, Toyama (JP); Masaki Murobayashi, Toyama (JP); Koichiro Harada, Toyama (JP); Tadashi Terasaki, Toyama (JP); Masanori Nakayama, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 327 days.

(21) Appl. No.: 17/484,586

(22) Filed: Sep. 24, 2021

(65) Prior Publication Data

US 2022/0010433 A1 Jan. 13, 2022

Related U.S. Application Data

(63) Continuation of application No. 16/136,943, filed on Sep. 20, 2018, now Pat. No. 11,155,922, and a (Continued)

(30) Foreign Application Priority Data

Apr. 20, 2016 (JP) .................................. 2016-084506
Nov. 1, 2016 (JP) .................................. 2016-214304

(51) Int. Cl.
*H01J 37/32* (2006.01)
*C23C 16/505* (2006.01)
(Continued)

(52) U.S. Cl.
CPC ............ *C23C 16/505* (2013.01); *C23C 16/44* (2013.01); *C23C 16/4583* (2013.01);
(Continued)

(58) Field of Classification Search
CPC ... C23C 16/505; C23C 16/44; C23C 16/4583; C23C 16/52; C23C 16/507;
(Continued)

(56) References Cited

U.S. PATENT DOCUMENTS 9,214,333 B1 12/2015 Sims et al.
2002/0041160 A1 4/2002 Barnes et al.
(Continued)

FOREIGN PATENT DOCUMENTS

CN 101162685 A 4/2008
JP 2001-326217 A 11/2001
(Continued)

OTHER PUBLICATIONS

Chinese Office Action dated Sep. 21, 2022 for Chinese Patent Application No. 201780014442.3 .
(Continued)

*Primary Examiner* — Rudy Zervigon
(74) *Attorney, Agent, or Firm* — Volpe Koenig

(57) ABSTRACT

A substrate processing apparatus comprising: a substrate process chamber having a plasma generation space where a processing gas is plasma-excited and a substrate processing space communicating with the plasma generation space; a substrate mounting table installed inside the substrate processing space and for mounting a substrate; an inductive coupling structure provided with a coil installed to be wound around an outer periphery of the plasma generation space; a substrate support table elevating part for raising and lowering the substrate mounting table; a gas supply part for supplying the processing gas to the plasma generation space;
(Continued)

and a controller for controlling the substrate support table elevating part, based on a power value of a high-frequency power supplied to the coil, so that the substrate mounted on the substrate mounting table is positioned at a target height according to the power value and spaced apart from a lower end of the coil.

12 Claims, 8 Drawing Sheets

Related U.S. Application Data continuation of application No. PCT/JP2017/012666, filed on Mar. 28, 2017.

(51) Int. Cl.
*H05H 1/46* (2006.01)
*C23C 16/44* (2006.01)
*C23C 16/52* (2006.01)
*C23C 16/458* (2006.01)
*H01L 21/02* (2006.01)

(52) U.S. Cl.
CPC ............ *C23C 16/52* (2013.01); *H01J 37/321* (2013.01); *H01J 37/3244* (2013.01); *H01J 37/32174* (2013.01); *H01J 37/32568* (2013.01); *H01L 21/02238* (2013.01); *H01L 21/02252* (2013.01); *H01L 21/02274* (2013.01); *H05H 1/46* (2013.01)

(58) Field of Classification Search
CPC ............ C23C 16/455; C23C 16/45591; C23C 16/4412; C23C 16/452; H01J 37/321; H01J 37/32174; H01J 37/3244; H01J 37/32568; H01J 37/32715; H01J 37/3211; H01J 37/32082; H01L 21/02238; H01L 21/02252; H01L 21/02274; H01L 21/68742; H05H 1/46

USPC ......... 118/723 I, 723 IR; 156/345.48, 345.49
See application file for complete search history.

(56) References Cited

U.S. PATENT DOCUMENTS

| | | | |
|---|---|---|---|
| 2003/0054658 A1 | 3/2003 | Liu | |
| 2004/0050327 A1* | 3/2004 | Johnson | ............ H01J 37/32082 |
| | | | 118/640 |
| 2005/0066902 A1 | 3/2005 | Fink | |
| 2008/0084649 A1 | 4/2008 | Chang et al. | |
| 2008/0122367 A1 | 5/2008 | Vindogradov et al. | |
| 2013/0019894 A1 | 1/2013 | Kudou et al. | |
| 2014/0106573 A1 | 4/2014 | Terasaki et al. | |
| 2019/0062947 A1* | 2/2019 | Savas | ................ H01J 37/32651 |

FOREIGN PATENT DOCUMENTS

| | | |
|---|---|---|
| JP | 2010-507878 A | 3/2010 |
| JP | 2013-026399 A | 2/2013 |
| JP | 2013-152968 A | 8/2013 |
| JP | 2014-075579 A | 4/2014 |
| WO | 01/12873 A1 | 2/2001 |

OTHER PUBLICATIONS

International Search Report for PCT/JP2017/012666, dated Apr. 25, 2017.
Koren Office Action dated Jul. 1, 2020 for Korean Patent Application No. 10-2018-7027237.
Korean Office Action dated Sep. 20, 2019, for Korean Patent Application No. 10-2018-7027237.
Japanese Office Action dated Oct. 10, 2019 for Japanese Patent Application No. 2018-513088.
Singaporean Search Report and Written Opinion dated Jun. 3, 2019, for Singaporean Patent Application No. 11201808206W.
Singapore Search Report and Written Opinion dated Dec. 21, 2022 for Singapore Patent Application No. 10202112891Q.

* cited by examiner

FIG. 8

Electron density at each measurement position

| | | Horizontal position (angle from center) | | | | |
|---|---|---|---|---|---|---|
| | | L2(−60°) | L1(−30°) | M(0°)(Center) | R1(+30°) | R2(+60°) |
| Height position | (a) Coil center (100 mm from coil lower end) | 8.68E+08 | 1.08E+08 | 6.45E+07 | 1.33E+08 | 9.69E+08 |
| | (b) Coil lower end (reference position) | 2.37E+08 | 5.28E+07 | 6.82E+07 | 8.25E+07 | 6.26E+08 |
| | (c) 38 mm from coil lower end | 9.76E+07 | 5.03E+07 | 1.27E+08 | 1.04E+08 | 1.17E+08 |
| | (d) 88 mm from coil lower end | 1.63E+07 | 4.35E+07 | 5.99E+07 | 7.28E+07 | 4.36E+07 |

Unit: [per cm$^3$]

[Measurement condition]
· Gas flow rate : $O_2$=950[sccm], $H_2$=50[sccm]
· Chamber pressure : 150[Pa]
· RF power : 3500[W]
· Wafer mounted 50 mm downward from height position (d)

METHOD OF MANUFACTURING SEMICONDUCTOR DEVICE, AND RECORDING MEDIUM

CROSS-REFERENCE TO RELATED APPLICATION

This application is a continuation of Ser. No. 16/136,943 filed Sep. 20, 2018 which is a bypass continuation application of international application No. PCT/JP2017/012666 having an international filing date of Mar. 28, 2017 and designating the United States, the international application being based upon and claiming the benefit of priority from Japanese Patent Application Nos. 2016-084506 and 2016-214304, filed on Apr. 20, 2016 and Nov. 1, 2016, respectively, the entire contents of which are incorporated herein by reference.

TECHNICAL FIELD

The present disclosure relates to a method of manufacturing a semiconductor device, and a non-transitory computer-readable recording medium.

BACKGROUND

In recent years, a semiconductor device such as a flash memory or the like tends to be highly integrated. Along with this, the size of patterns has been remarkably miniaturized. When forming these patterns, as one of various manufacturing processes, a process of performing a predetermined process such as an oxidizing process or a nitriding process on a substrate may be performed in some cases.

For example, there is known a technique which modifies a surface of a pattern formed on a substrate using a plasma-excited processing gas.

However, when processing a substrate by plasma-exciting a processing gas, if the density of plasma generated on the surface of the substrate is uneven, the surface of the substrate is not uniformly processed. Thus, variations may occur in the performance of the semiconductor device manufactured from the substrate.

SUMMARY

The present disclosure provides some embodiments of a technique capable of reducing unevenness in the density of plasma generated on a substrate surface and improving the in-plane uniformity of a substrate process, when performing the substrate process by plasma-exciting a processing gas.

According to one embodiment of the present disclosure, there is provided a method of manufacturing a semiconductor device, including: loading a substrate into a substrate process chamber having a plasma generation space in which a processing gas is plasma-excited and a substrate process space communicating with the plasma generation space; mounting the substrate on a substrate mounting table installed inside the substrate process space; adjusting a height of the substrate mounting table so that the substrate mounted on the substrate mounting table is located at a height lower than a lower end of a coil, the coil configured to wind around an outer periphery of the plasma generation space so as to have a diameter larger than a diameter of the substrate; supplying the processing gas to the plasma generation space; plasma-exciting the processing gas supplied to the plasma generation space by supplying a high-frequency power to the coil to resonate the coil; and processing the substrate mounted on the substrate mounting table by the plasma-excitation.

BRIEF DESCRIPTION OF DRAWINGS

FIG. 8 is a view showing the measurement values of plasma density distributions at the height positions in the verification example.

DETAILED DESCRIPTION

Figure 1:
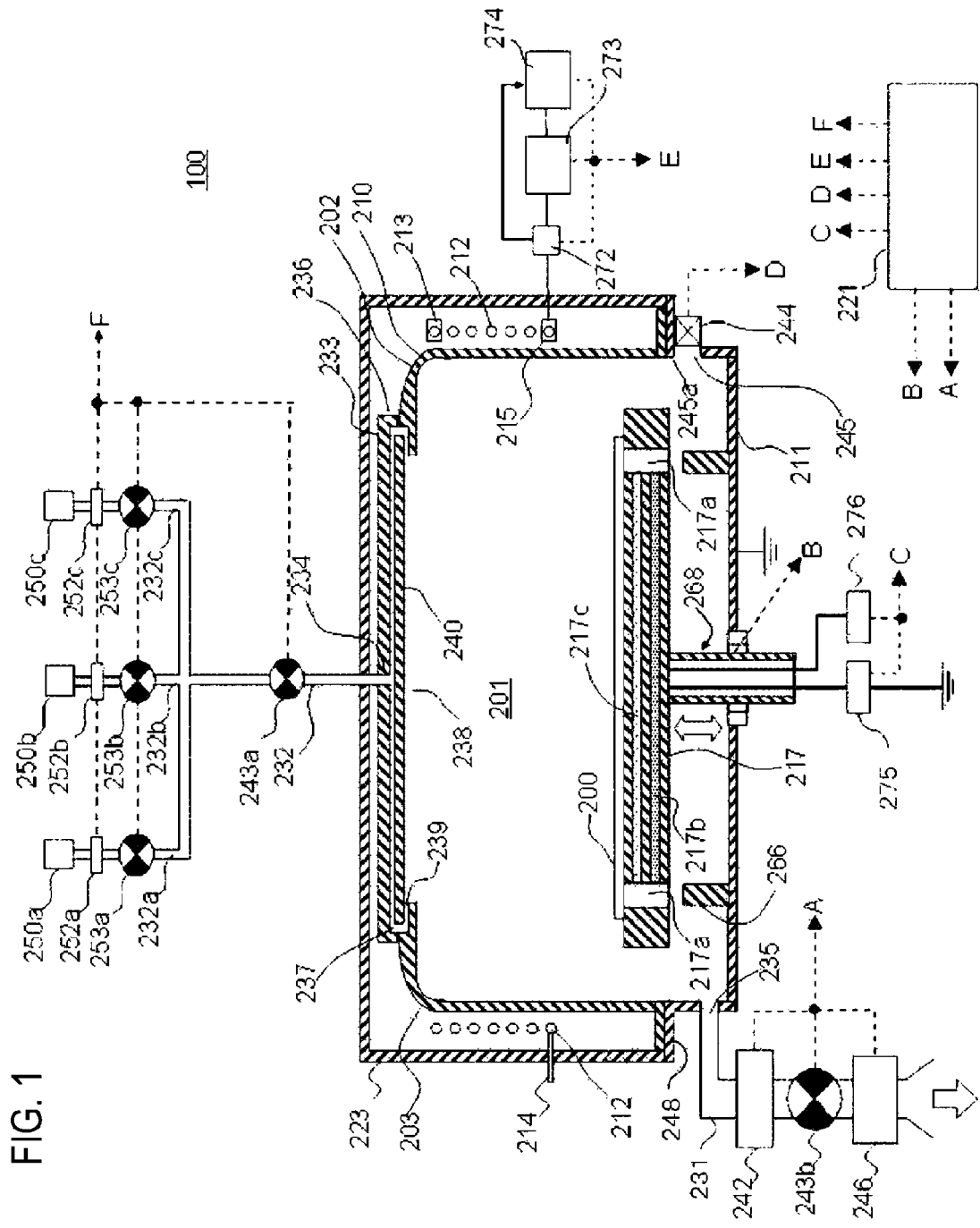
FIG. 1 is a schematic sectional view of a substrate processing apparatus according to an embodiment of the present disclosure.

First Embodiment of the Present Disclosure (1) Configuration of Substrate Processing Apparatus A substrate processing apparatus according to a first embodiment of the present disclosure will be described below with reference to FIGS. 1 and 2. The substrate processing apparatus according to the present embodiment is configured to mainly perform an oxidizing process on a film formed on a surface of a substrate.

(Process Chamber)

A processing device 100 includes a process furnace 202 for plasma-processing a wafer 200. A process container 203 constituting a process chamber 201 is installed in the process furnace 202. The process container 203 includes a dome-shaped upper container 210 which is a first container and a bowl-shaped lower container 211 which is a second container. The lower container 211 is covered with the upper container 210 so that the process chamber 201 is formed. The upper container 210 is made of, for example, a nonmetallic material such as aluminum oxide ($Al_2O_3$) or quartz ($SiO_2$), and the lower container 211 is made of, for example, aluminum (Al).

In addition, a gate valve 244 is installed in a lower side wall of the lower container 211. When the gate valve 244 is opened, the wafer 200 can be loaded into or unloaded from the process chamber 201 via a loading/unloading port 245 using a transfer mechanism (not shown). The gate valve 244, when being closed, serves as a partitioning valve for securing airtightness inside the process chamber 201.

The process chamber 201 includes a plasma generation space 201a around which a resonance coil 212 is installed, and a substrate process space 201b which is in communication with the plasma generation space 201a and which processes the wafer 200 received therein. The plasma generation space 201a is a space in which plasma is generated. The plasma generation space 201a refers to a space defined above a lower end of the resonance coil 212 and below an upper end of the resonance coil 212 inside the process chamber 201. On the other hand, the substrate process space 201b is a space in which the substrate is processed using plasma. The substrate process space 201b refers to a space defined below the lower end of the resonance coil 212. In the present embodiment, the diameters of the plasma generation space 201a and the substrate process space 201b in the horizontal direction are set to be substantially equal to each other.

(Susceptor)

A susceptor (substrate mounting table) 217 serving as a substrate mounting part for mounting the wafer 200 thereon is disposed at the bottom center of the process chamber 201. The susceptor 217 is made of, for example, a nonmetallic material such as aluminum nitride (AlN), ceramics, quartz or the like, and is configured to reduce metal contamination on a film or the like formed on the wafer 200.

A heater 217b as a heating mechanism is integrally embedded in the susceptor 217. The heater 217b is configured to, when supplied with electric power, heat the surface of the wafer 200, for example, from 25 degrees C. to 750 degrees C.

The susceptor 217 is electrically insulated from the lower container 211. An impedance adjustment electrode 217c is installed inside the susceptor 217 in order to further improve the uniformity of the density of the plasma generated on the wafer 200 which is mounted on the susceptor 217. The impedance adjustment electrode 217c is grounded via an impedance varying mechanism 275 as an impedance adjustment part. The impedance varying mechanism 275 is composed of a coil and a variable capacitor. The impedance varying mechanism 275 is configured to vary the impedance within a range from about 0Ω to a parasitic impedance value of the process chamber 201 by controlling inductance and resistance of the coil and a capacitance value of the variable capacitor. As a result, the potential (bias voltage) of the wafer 200 can be controlled via the impedance adjustment electrode 217c and the susceptor 217. In the present embodiment, the uniformity of the density of the plasma generated on the wafer 200 can be improved as will be described later. Therefore, if the uniformity of the density of the plasma falls within a desired range, the bias voltage control using the impedance adjustment electrode 217c is not performed. Further, when the bias voltage control is not performed, the impedance adjustment electrode 217c may not be installed in the susceptor 217. However, the bias voltage control may be performed for the purpose of further improving the uniformity.

A susceptor elevating mechanism 268 equipped with a driving mechanism for raising and lowering the susceptor 217 is installed in the susceptor 217. In addition, through-holes 217a are formed in the susceptor 217, and wafer lifting pins 266 are installed on the bottom surface of the lower container 211. The through-holes 217a and the wafer lifting pins 266 are provided at at least three locations at respective positions facing each other. When the susceptor 217 is lowered by the susceptor elevating mechanism 268, the wafer lifting pins 266 are configured to penetrate the through-holes 217a in a state in which the wafer lifting pins 266 do not make contact with the susceptor 217. A substrate mounting part according to the present embodiment is mainly configured by the susceptor 217, the heater 217b and the electrode 217c.

(Gas Supply Part)

A gas supply head 236 is installed above the process chamber 201, namely above the upper portion of the upper container 210. The gas supply head 236 includes a cap-like lid 233, a gas inlet port 234, a buffer chamber 237, an opening 238, an additional shielding plate 240 and a gas outlet port 239. The gas supply head 236 is configured to supply a reaction gas into the process chamber 201. The buffer chamber 237 functions as a dispersion space for dispersing the reaction gas introduced from the gas inlet port 234.

A downstream end of an oxygen-containing gas supply pipe 232a for supplying an oxygen ($O_2$) gas as an oxygen-containing gas, a downstream end of a hydrogen-containing gas supply pipe 232b for supplying a hydrogen ($H_2$) gas as a hydrogen-containing gas and a downstream end of an inert gas supply pipe 232c for supplying an argon (Ar) gas as an inert gas are connected to the gas inlet port 234 while being joined with each other. In the oxygen-containing gas supply pipe 232a, an $O_2$ gas supply source 250a, a mass flow controller (MFC) 252a as a flow rate control device and a valve 253a as an opening/closing valve are installed sequentially from the upstream side. In the hydrogen-containing gas supply pipe 232b, an $H_2$ gas supply source 250b, an MFC 252b and a valve 253b are installed sequentially from the upstream side. In the inert gas supply pipe 232c, an Ar gas supply source 250c, an MFC 252c and a valve 253c are installed sequentially from the upstream side. A valve 243a is installed at the downstream side of the joint point of the oxygen-containing gas supply pipe 232a, the hydrogen-containing gas supply pipe 232b and the inert gas supply pipe 232c. The valve 243a is connected to an upstream end of the gas inlet port 234. By opening and closing the valves 253a, 253b, 253c and 243a, a processing gas such as the oxygen-containing gas, the hydrogen-containing gas, the inert gas or the like can be supplied into the process chamber 201 via the gas supply pipes 232a, 232b and 232c while controlling the flow rates of the respective gases by the MFCs 252a, 252b and 252c.

A gas supply part (gas supply system) according to the present embodiment is mainly constituted by the gas supply head 236 (the lid 233, the gas inlet port 234, the buffer chamber 237, the opening 238, the additional shielding plate 240 and the gas outlet port 239), the oxygen-containing gas supply pipe 232a, the hydrogen-containing gas supply pipe 232b, the inert gas supply pipe 232c, the MFCs 252a, 252b and 252c, and the valves 253a, 253b, 253c and 243a.

Further, an oxygen-containing gas supply system according to the present embodiment is constituted by the gas supply head 236, the oxygen-containing gas supply pipe 232a, the MFC 252a, and the valves 253a and 243a. Moreover, a hydrogen gas supply system according to the present embodiment is constituted by the gas supply head 236, the hydrogen-containing gas supply pipe 232b, the MFC 252b, and the valves 253b and 243a. In addition, an inert gas supply system according to the present embodiment is constituted by the gas supply head 236, the inert gas supply pipe 232c, the MFC 252c, and the valves 253c and 243a.

The substrate processing apparatus according to the present embodiment is configured to perform an oxidizing process by supplying an $O_2$ gas as an oxygen-containing gas from the oxygen-containing gas supply system. However, a nitrogen-containing gas supply system for supplying a nitrogen-containing gas into the process chamber 201 may be installed in place of the oxygen-containing gas supply system. According to the substrate processing apparatus configured as described above, a nitriding process can be performed on the substrate instead of the oxidizing process. In this case, for example, an $N_2$ gas supply source as the nitrogen-containing gas supply source may be installed instead of the $O_2$ gas supply source 250a, and the oxygen-containing gas supply pipe 232a may be configured as a nitrogen-containing gas supply pipe.

(Exhaust Part)

A gas exhaust port 235 for exhausting the reaction gas outward from the interior of the process chamber 201 is formed in the side wall of the lower container 211. An upstream end of a gas exhaust pipe 231 is connected to the gas exhaust port 235. In the gas exhaust pipe 231, an APC (Auto Pressure Controller) 242 as a pressure regulator (pressure regulating part), a valve 243b as an opening/closing valve and a vacuum pump 246 as a vacuum exhaust device are installed sequentially from the upstream side. An exhaust part according to the present embodiment is mainly constituted by the gas exhaust port 235, the gas exhaust pipe 231, the APC 242 and the valve 243b. The vacuum pump 246 may be included in the exhaust part.

(Plasma Generation Part)

The resonance coil 212 having a helical shape as a first electrode is installed so as to surround the process chamber 201 in an outer peripheral portion of the process chamber 201, namely outside the side wall of the upper container 210. A RF sensor 272, a high-frequency power supply 273 and a matcher 274 for matching an impedance and an output frequency of the high-frequency power supply 273 are connected to the resonance coil 212.

The high-frequency power supply 273 is configured to supply a high-frequency power (RF power) to the resonance coil 212. The RF sensor 272 is installed at the output side of the high-frequency power supply 273 and is configured to monitor information on a traveling wave or a reflected wave of the supplied high-frequency power. The reflected wave power monitored by the RF sensor 272 is inputted to the matcher 274. Based on the information on the reflected wave inputted from the RF sensor 272, the matcher 274 is configured to control the impedance of the high-frequency power supply 273 and a frequency of the outputted high-frequency power so that the reflected wave is minimized.

The high-frequency power supply 273 includes a power supply control means (control circuit) which is provided with a high-frequency oscillation circuit and a preamplifier for defining an oscillation frequency and output power, and an amplifier (output circuit) for amplifying electric power to predetermined output power. The power supply control means controls the amplifier based on output conditions relating to the frequency and power set in advance through an operation panel. The amplifier supplies constant high-frequency power to the resonance coil 212 via a transmission line.

In order for the resonance coil 212 to form a standing wave of a predetermined wavelength, a winding diameter, a winding pitch and the number of turns of the resonance coil 212 are set so that the resonance coil 212 can resonate at a certain wavelength. That is to say, an electrical length of the resonance coil 212 is set to a length corresponding to an integral multiple (1 time, 2 times, or . . . ) of one wavelength at a predetermined frequency of the high-frequency power supplied from the high-frequency power supply 273.

Specifically, in view of the applied electric power, the generated magnetic field strength, the applied external form of the apparatus and the like, the resonance coil 212 is configured to have an effective sectional area of 50 to 300 $mm^2$ and a coil diameter of 200 to 500 mm and to be wound around the outer periphery side of a room in which the plasma generation space 201a is formed by about 2 to 60 turns, so that the resonance coil 212 can generate a magnetic field of about 0.01 to 10 gauss at, for example, the frequency of 800 kHz to 50 MHz and the high-frequency power of 0.5 to 5 kW.

As an embodiment, for example, when the frequency is 13.56 MHz, the length of one wavelength is about 22 meters. When the frequency is 27.12 MHz, the length of one wavelength is about 11 meters. The electrical length of the resonance coil 212 is set to become these lengths of one wavelength (1 time). In the present embodiment, the frequency of the high-frequency power is set to 27.12 MHz and the electrical length of the resonance coil 212 is set to the length of one wavelength (about 11 meters). The winding pitch of the resonance coil 212 is set so that the resonance coil 212 is wound at equal intervals, for example, at intervals of 24.5 mm. Further, the winding diameter of the resonance coil 212 is set to be larger than the diameter of the wafer 200. In the present embodiment, the diameter of the wafer 200 is 300 mm, and the winding diameter of the resonance coil 212 is 500 mm which is larger than the diameter of the wafer 200.

A copper pipe, a thin copper plate, an aluminum pipe, a thin aluminum plate, a material obtained by vapor-depositing copper or aluminum on a polymer belt, or the like is used as a material constituting the resonance coil 212. The resonance coil 212 is formed in a flat plate shape with an insulating material, and is supported by a plurality of supports (not shown) installed vertically on an upper end face of a base plate 248.

Both ends of the resonance coil 212 are electrically grounded. At least one of the both ends of the resonance coil 212 is grounded via a movable tap 213 so as to finely adjust the electrical length of the resonance coil 212 at the time of initially installing the device or at the time of changing process conditions. Reference numeral 214 in FIG. 1 denotes a fixed ground which is installed at the other side of the resonance coil 212. The position of the movable tap 213 is adjusted so that the resonance characteristic of the resonance coil 212 becomes substantially equal to that of the high-frequency power supply 273. In order to finely adjust the impedance of the resonance coil 212 at the time of the initial installation of the device or at the time of the change of the process conditions, a power feeding part is configured by providing the movable tap 215 between the grounded ends of the resonance coil 212. Since the resonance coil 212 includes the variable ground part and the variable power feeding part, it is possible to adjust the resonance frequency and the load impedance of the process chamber 201 in a more simplified manner, which will be described later.

Further, a waveform adjustment circuit (not shown) including a coil and a shield is inserted to one end (or the other end or both ends) of the resonance coil 212 so that a phase current and an antiphase current flows symmetrically with respect to the electric midpoint of the resonance coil 212. The waveform adjustment circuit is configured as an opened circuit by setting the end portion of the resonance coil 212 to stay in an electrical disconnection state or setting the end portion of the resonance coil 212 to stay in an electrical equivalent state. The end portion of the resonance coil 212 may be ungrounded by a choke series resistor and may be DC-connected to a fixed reference potential.

A shielding plate 223 is installed to shield an electric field outside the resonance coil 212 and to form a capacitance component (C component) necessary for constructing the resonance circuit between the shielding plate 223 and the resonance coil 212. In general, the shielding plate 223 is formed in a cylindrical shape with a conductive material such as an aluminum alloy or the like. The shielding plate 223 is disposed at a distance of about 5 to 150 mm from the outer periphery of the resonance coil 212. Normally, the shielding plate 223 is grounded so that the potential thereof becomes equal to that of both ends of the resonance coil 212. However, in order to accurately set the resonance number of the resonance coil 212, one end or both ends of the shielding plate 223 is configured so that a tap position can be adjusted. Alternatively, in order to accurately set the resonance number, a trimming capacitance may be inserted between the resonance coil 212 and the shielding plate 223.

A plasma generation part according to the present embodiment is mainly constituted by the resonance coil 212, the RF sensor 272 and the matcher 274. The high-frequency power supply 273 may be included in the plasma generation part.

A plasma generation principle of the device according to the present embodiment and properties of the generated plasma will now be described with reference to FIG. 2. A plasma generation circuit constituted by the resonance coil 212 is composed of a parallel resonance circuit of RLC. When the wavelength of the high-frequency power supplied from the high-frequency power supply 273 is equal to the electrical length of the resonance coil 212, the resonance condition of the resonance coil 212 is such that a reactance component produced by a capacitive component and an inductive component of the resonance coil 212 is canceled out and becomes a pure resistance. However, in the plasma generation circuit described above, when plasma is generated, the actual resonance frequency fluctuates slightly due to a fluctuation in capacitive coupling between a voltage portion of the resonance coil 212 and the plasma, a fluctuation in inductive coupling between the plasma generation space 201a and the plasma, an excited state of the plasma, and the like.

Thus, in the present embodiment, the deviation of resonance in the resonance coil 212 at the time of plasma generation is compensated at the side of the power supply. To do this, the reflected wave power from the resonance coil 212 at the time of plasma generation is detected by the RF sensor 272. The matcher 274 has a function of correcting the output of the high-frequency power supply 273 based on the reflected wave power thus detected.

Specifically, based on the reflected wave power from the resonance coil 212 at the time of plasma generation, which is detected by the RF sensor 272, the matcher 274 increases or decreases the impedance or the output frequency of the high-frequency power supply 273 so as to minimize the reflected wave power. In the case of controlling the impedance, the matcher 274 is constituted by a variable capacitor control circuit for correcting a preset impedance. In the case of controlling the frequency, the matcher 274 is constituted by a frequency control circuit for correcting a preset oscillation frequency of the high-frequency power supply 273. The high-frequency power supply 273 and the matcher 274 may be configured as a single unit.

Figure 2:
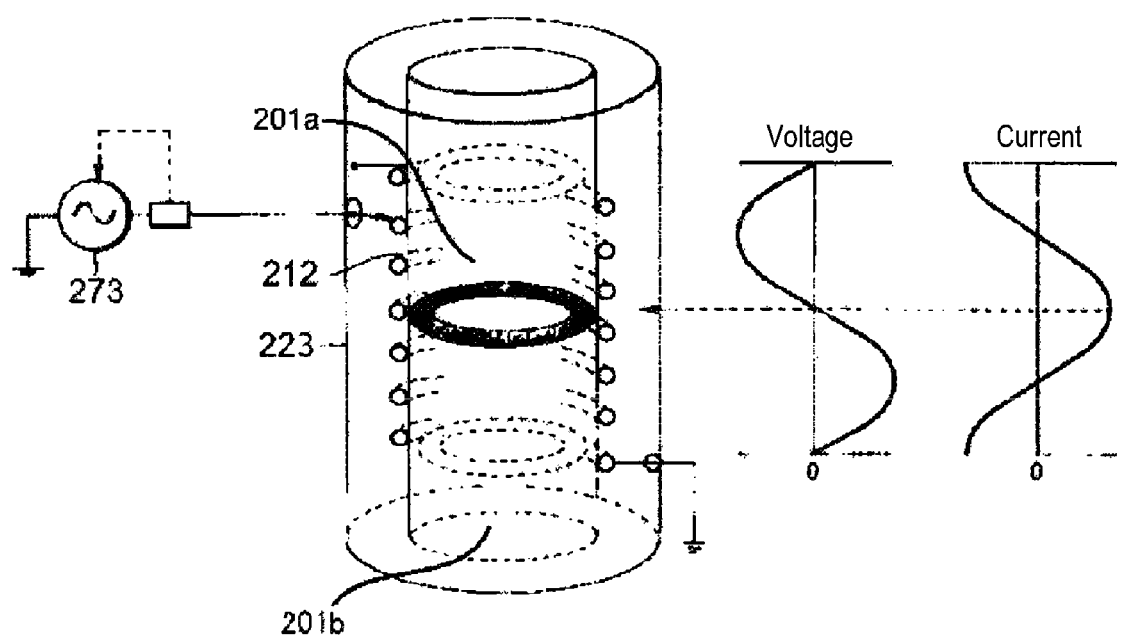
FIG. 2 is an explanatory view for explaining a plasma generation principle of a substrate processing apparatus according to an embodiment of the present disclosure.

With such a configuration, in the resonance coil 212 according to the present embodiment, as shown in FIG. 2, the high frequency power according to the actual resonance frequency of the resonance coil including plasma is supplied (or, the high-frequency power is supplied so as to match the impedance of the resonance coil including plasma). This forms a standing wave in a state where the phase voltage and the antiphase voltage are always canceled out. When the electrical length of the resonance coil 212 is equal to the wavelength of the high-frequency power, the highest phase current is generated at the electrical midpoint of the coil, an electrical upper end of the coil, and an electrical lower end of the coil (at a node where the voltage is zero). Therefore, a donut-like induction plasma, which has almost no capacitive coupling with the wall of the process chamber or the susceptor 217 and which has extremely low electric potential, is formed in the vicinity of the electrical midpoint, the electrical upper end, and the electrical lower end of the coil.

(Control Part)

A controller 221 as the control part is configured to control the APC 242, the valve 243b and the vacuum pump 246 through a signal line A, control the susceptor elevating mechanism 268 through a signal line B, control the heater power adjustment mechanism 276 and the impedance varying mechanism 275 through a signal line C, control the gate valve 244 through a signal line D, control the RF sensor 272, the high-frequency power supply 273 and the matcher 274 through a signal line E, and control the MFCs 252a to 252c and the valves 253a to 253c and 243a through a signal line F.

Figure 3:
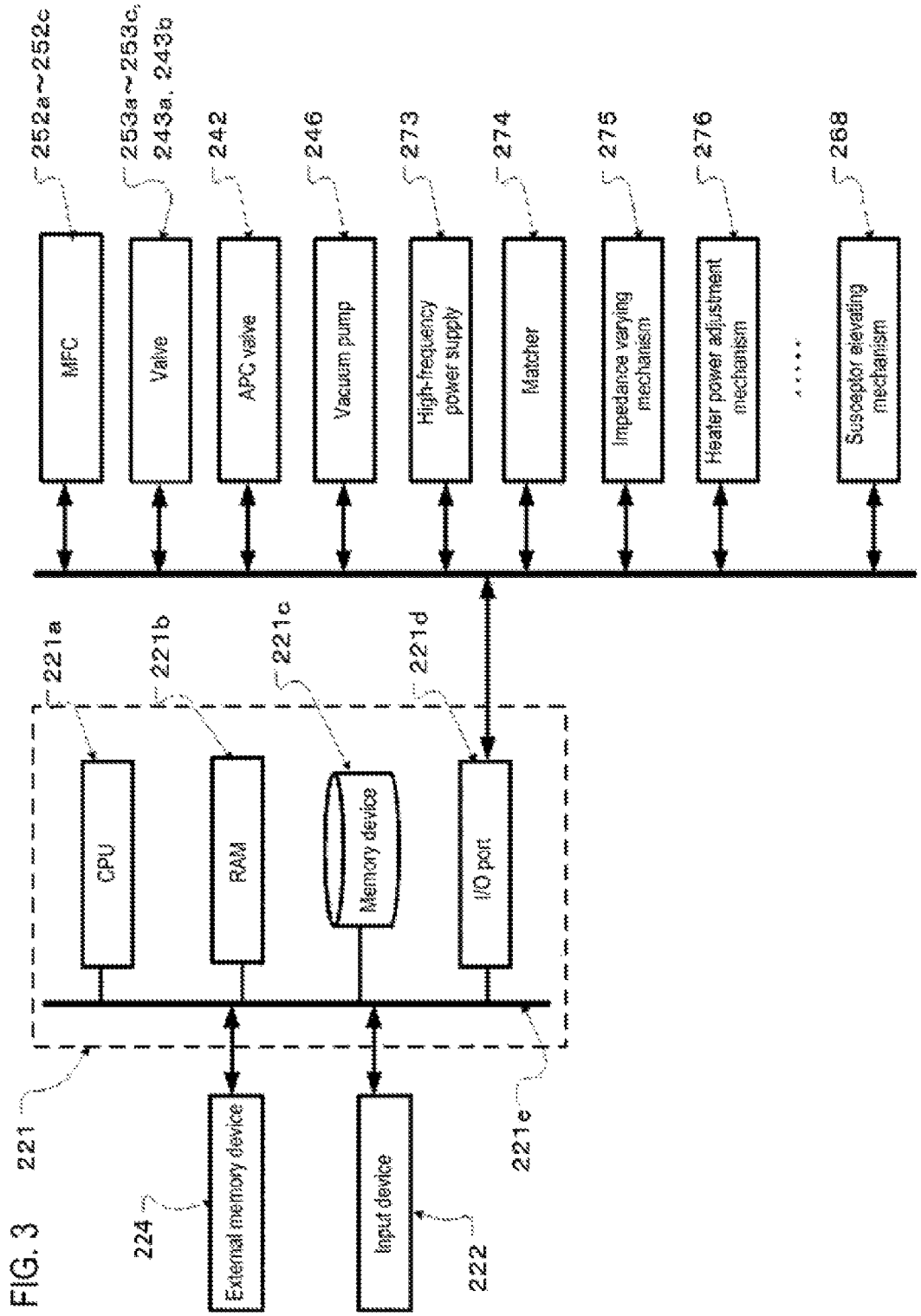
FIG. 3 is a view showing a configuration of a control part (control means) of a substrate processing apparatus according to an embodiment of the present disclosure.

As shown in FIG. 3, the controller 221 used as the control part (control means) is configured as a computer including a CPU (Central Processing Unit) 221a, a RAM (Random Access Memory) 221b, a memory device 221c and an I/O port 221d. The RAM 221b, the memory device 221c and the I/O port 221d are configured to exchange data with the CPU 221a via an internal bus 221e. An input/output device 222 composed of, for example, a touch panel, a display or the like is connected to the controller 221.

The memory device 221c is composed of, for example, a flash memory, an HDD (Hard Disk Drive) or the like. In the memory device 221c, a control program for controlling the operation of the substrate processing apparatus, a process recipe in which sequences and conditions of the substrate process to be described later are written, and the like are stored in a readable manner. The process recipe functions as a program to cause the controller 221 to execute respective sequences in the substrate process to be described later so as to obtain a predetermined result. Hereinafter, the process recipe and the control program will be generally and simply referred to as a "program." When the term "program" is used herein, it may indicate a case of including only the process recipe, a case of including only the control program, or a case of including both the process recipe and the control program. The RAM 221b is configured as a memory area (work area) in which a program or data read by the CPU 221a is temporarily stored.

The I/O port 221d is connected to the MFCs 252a to 252c, the valves 253a to 253c, 243a and 243b, the gate valve 244, the APC 242, the vacuum pump 246, the RF sensor 272, the high-frequency power supply 273, the matcher 274, the susceptor elevating mechanism 268, the impedance varying mechanism 275, the heater power adjustment mechanism 276, and the like.

The CPU 221a is configured to read the control program from the memory device 221c and execute the same. The CPU 221a is also configured to read the process recipe from the memory device 221c according to an operation command inputted from the input/output device 222. The CPU 221a is configured to, according to the contents of the process recipe thus read, control the operation of adjusting the opening degree of the APC 242, the opening/closing operation of the valve 243b and the startup/stoppage of the vacuum pump 246 through the I/O port 221d and the signal line A, control the elevating operation of the susceptor elevating mechanism 268 through the signal line B, control the power supply amount adjustment operation (temperature adjustment operation) of the heater 217b performed by the heater power adjustment mechanism 276 and the impedance value adjustment operation performed by the impedance varying mechanism 275 through the signal line C, control the opening/closing operation of the gate valve 244 through the signal line D, control the operations of the RF sensor 272, the matcher 274 and the high-frequency power supply 273 through the signal line E, and control the flow rate adjustment operation of various gases performed by the MFCs 252a to 252c and the opening/closing operation of the valves 253a to 253c and 243a through the signal line F.

The controller 221 may be configured by installing, on a computer, the aforementioned program stored in an external memory device 224 (for example, a magnetic tape, a magnetic disk such as a flexible disk, a hard disk or the like, an optical disk such as a CD, a DVD or the like, a magneto-optical disk such as an MO or the like, or a semiconductor memory such as a USB memory, a memory card or the like). The memory device 221c or the external memory device 224 is configured as a non-transitory computer-readable recording medium. Hereinafter, the memory device 221c and the external memory device 224 will be generally and simply referred to as a "recording medium." When the term "recording medium" is used herein, it may indicate a case of including only the memory device 221c, a case of including only the external memory device 224, or a case of including both the memory device 221c and the external memory device 224. The provision of the program to the computer may be performed using a communication means such as the Internet or a dedicated line without using the external memory device 224.

(2) Substrate Process

Figure 4:
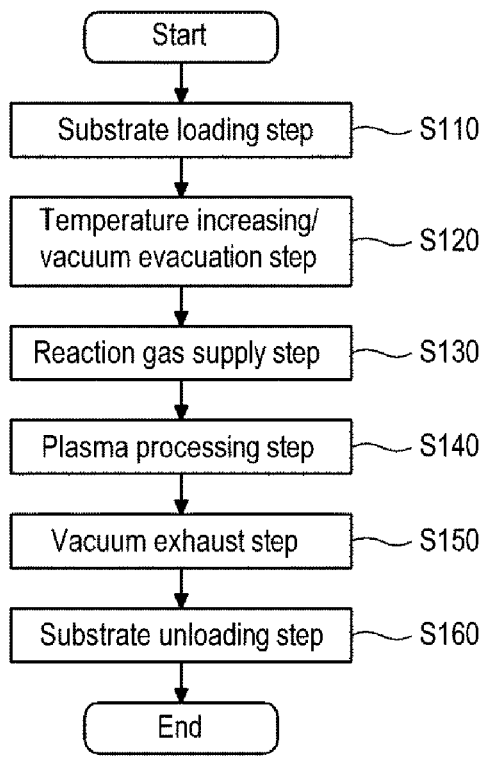
FIG. 4 is a flowchart showing a substrate process according to an embodiment of the present disclosure.

Next, the substrate process according to the present embodiment will be described mainly with reference to FIG. 4. FIG. 4 is a flowchart showing the substrate process according to the present embodiment. As one of various processes of manufacturing a semiconductor device such as a flash memory or the like, the substrate process according to the present embodiment is executed by the above-described processing device 100. In the following description, the operations of the respective parts constituting the processing device 100 are controlled by the controller 221.

Figure 5:
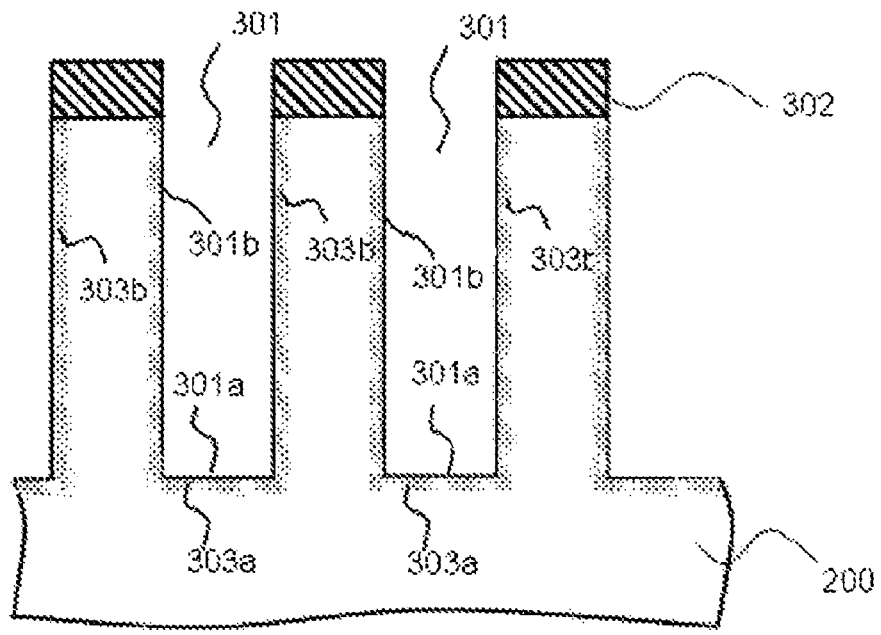
FIG. 5 is an explanatory view of a substrate on which a groove (trench) to be processed in a substrate process according to an embodiment of the present disclosure is formed.

For example, as shown in FIG. 5, a trench 301 having at least a silicon layer formed thereon and having an uneven portion with a high aspect ratio is formed in advance on the surface of the wafer 200 processed in the substrate process according to the present embodiment. In the present embodiment, the silicon layer exposed on an inner wall of the trench 301 is subjected to an oxidizing process as a plasma-based process. The trench 301 is formed by, for example, forming a mask layer 302 having a predetermined pattern on the wafer 200 and subsequently etching the surface of the wafer 200 to a predetermined depth.

(Substrate Loading Step S110)

First, the wafer 200 is loaded into the process chamber 201. More specifically, the susceptor elevating mechanism 268 lowers the susceptor 217 to a wafer transfer position at which the wafer 200 is transferred, thereby allowing the wafer lifting pins 266 to pass through the respective through-holes 217a of the susceptor 217. As a result, the wafer lifting pins 266 remains protruded by a predetermined height from the surface of the susceptor 217.

Subsequently, the gate valve 244 is opened, and the wafer 200 is loaded into the process chamber 201 from a vacuum transfer chamber adjacent to the process chamber 201 by using a wafer transfer mechanism (not shown). The loaded wafer 200 is supported on the wafer lifting pins 266 protruding from the surface of the susceptor 217 in a horizontal posture. After loading the wafer 200 into the process chamber 201, the wafer transfer mechanism is withdrawn outward of the process chamber 201. The gate valve 244 is closed to hermetically seal the interior of the process chamber 201. Then, the susceptor elevating mechanism 268 raises the susceptor 217 so that the wafer 200 is supported on the upper surface of the susceptor 217.

(Temperature Increasing/Vacuum Exhaust Step S120)

Subsequently, the temperature of the wafer 200 loaded into the process chamber 201 is increased. The heater 217b is heated in advance. By holding the wafer 200 on the susceptor 217 in which the heater 217b is embedded, the wafer 200 is heated to a predetermined temperature falling within a range of, for example, 150 to 750 degrees C. In the present embodiment, the wafer W is heated at a temperature of 600 degrees C. While increasing the temperature of the wafer 200, the interior of the process chamber 201 is evacuated by the vacuum pump 246 via the gas exhaust pipe 231, thereby setting an internal pressure of the process chamber 201 to a predetermined value. The vacuum pump 246 is operated at least until a substrate unloading step S160 described later is completed.

(Reaction Gas Supply Step S130)

Subsequently, an $O_2$ gas as the oxygen-containing gas and an $H_2$ gas as the hydrogen-containing gas, which are reaction gases, are started to be supplied. Specifically, the valves 253a and 253b are opened, and the supply of the $O_2$ gas and the $H_2$ gas into the process chamber 201 is started while controlling flow rates thereof with the MFCs 252a and 252b. At this time, the flow rate of the $O_2$ gas is set to a predetermined value falling within a range of, for example, 20 to 2,000 sccm, specifically 20 to 1,000 sccm. The flow rate of the $H_2$ gas is set to a predetermined value falling within a range of, for example, 20 to 1,000 sccm, specifically 20 to 500 sccm. As a more specific example, the total flow rate of the $O_2$ gas and the $H_2$ gas may be set to 1,000 sccm, and a flow rate ratio of the $O_2$ gas to the $H_2$ gas may be set to $O_2/H_2 \geq 950/50$. In addition, the exhaust of the interior of the process chamber 201 is controlled by adjusting the opening degree of the APC 242 so that the internal pressure of the process chamber 201 becomes a predetermined pressure falling within a range of, for example, 1 to 250 Pa, specifically 50 to 200 Pa, and more specifically about 150 Pa. While appropriately exhausting the interior of the process chamber 201 as described above, the supply of the $O_2$ gas and the $H_2$ gas is continued until the end of a plasma processing step S140 described later.

(Plasma Processing Step S140)

After the internal pressure of the process chamber 201 is stabilized, the high-frequency power begins to be applied to the resonance coil 212 from the high-frequency power supply 273 via the RF sensor 272. In the present embodiment, the high-frequency power of 27.12 MHz is supplied from the high-frequency power supply 273 to the resonance coil 212. The high-frequency power supplied to the resonance coil 212 is a predetermined electric power falling within a range of, for example, 100 to 5,000 W, specifically 100 to 3,500 W, and more specifically about 3,500 W. When the electric power is lower than 100 W, it is difficult to stably generate the plasma discharge.

As a result, a high-frequency electric field is formed inside the plasma generation space 201a to which the $O_2$ gas and the $H_2$ gas are supplied. By virtue of this electric field, donut-like induction plasma having a highest plasma density is excited at a height position corresponding to the electrical midpoint of the resonance coil 212 inside the plasma generation space. Each of the plasmarized $O_2$ gas and the plasmarized $H_2$ gas is dissociated, whereby reactive species such as oxygen radicals containing oxygen (oxygen active species) or oxygen ions, hydrogen radicals containing hydrogen (hydrogen active species) or hydrogen ions, and the like are generated.

As described above, when the electrical length of the resonance coil 212 is equal to the wavelength of the high-frequency power, donut-like induction plasma having an extremely low electrical potential is excited inside the plasma generation space 201a in the vicinity of the electrical midpoint of the resonance coil 212 while making almost no capacitive coupling with the wall of the process chamber and the substrate mounting table. Since the plasma having an extremely low electrical potential is generated, it is possible to prevent a sheath from being generated on the wall of the plasma generation space 201a or on the susceptor 217. Therefore, in the present embodiment, ions in the plasma are not accelerated.

Radicals generated by induction plasma and ions kept in a non-accelerated state are uniformly supplied into the trench 301 of the wafer 200 held on the susceptor 217 inside the substrate process space 201b. The supplied radicals and ions uniformly react with side walls 301a and 301b to modify the silicon layer formed on the surface into a silicon oxide layer having good step coverage.

Furthermore, since the acceleration of ions is prevented, it is possible to suppress damage of the wafer 200 due to accelerated ions. Furthermore, the sputtering action on the peripheral wall of the plasma generation space can be suppressed so that peripheral wall of the plasma generation space 201a does not undergo damage.

Moreover, the reflected wave power caused by the impedance mismatch generated by the resonance coil 212 is compensated at the side of the high-frequency power supply 273 by the matcher 274 attached to the high-frequency power supply 273 so that a reduction in effective load power is complemented. Thus, it is possible to reliably supply an initial level of high-frequency power to the resonance coil 212 at all times and to stabilize the plasma. Accordingly, the wafer 200 held in the substrate process space 201b can be uniformly processed at a constant rate.

In the case of the present embodiment, the susceptor elevating mechanism 268 is controlled so that the vertical position of the wafer 200 in the plasma processing step is set at a distance of 38 mm or more downward away from the lower end of the resonance coil 212. By setting the position of the wafer 200 in the plasma processing step as described above, it is possible for the wafer 200 to be spaced apart by a sufficient distance from the donut-like induction plasma formed inside the plasma generation space 201a as described later. Therefore, the density of the plasma generated on the surface of the wafer 200 becomes uniform in the plane direction (horizontal direction), which makes it possible to uniformly perform the plasma process in the plane of the wafer 200. That is to say, in the plane of the wafer 200, the uniformity of the thickness of the layer (silicon oxide layer in the present embodiment) formed by the plasma process can be improved.

If the case where the winding diameter of the resonance coil 212 is larger than the diameter of the wafer 200 as in the present embodiment (for example, if the winding diameter of the resonance coil 212 is 500 mm whereas the diameter of the wafer 200 is 300 mm), no donut-like induction plasma is generated directly above the wafer 200. Thus, the deviation of the density of the plasma generated above the surface of the wafer 200 is lessened. This makes it possible to improve the uniformity of the plasma process in the plane of the wafer 200.

In the present embodiment, so as to support the wafer 200 on the upper surface of the susceptor 217, it is preferable that the susceptor 217 is raised so that the vertical position of the wafer 200 is higher than the tips of the wafer lifting pins 266. If the vertical position of the wafer 200 in the plasma processing step is too spaced apart downward from the lower end of the resonance coil 212, the radicals and ions generated by the plasma may be deactivated. As a result, a process rate may be below a practical value. Therefore, the vertical position of the wafer 200 in the plasma processing step needs to be at least such a position that the radicals and ions generated by the plasma are not deactivated. According to the verification conducted by the present inventors, it has been confirmed that, in the present embodiment, if the vertical position of the wafer 200 falls within a range of 138 mm downward from the lower end of the resonance coil 212, the uniformity of the plasma process in the wafer plane can be sufficiently secured while maintaining a practical process rate.

Thereafter, when a predetermined period of process time, for example, 10 to 300 seconds elapses, the output of the electric power from the high-frequency power supply 273 is stopped so that the plasma discharge inside the process chamber 201 is stopped. In addition, the valves 253a and 253b are closed to stop the supply of the $O_2$ gas and the $H_2$ gas into the process chamber 201. In this way, the plasma processing step S140 is completed.

(Vacuum Exhaust Step S150)

After the supply of the $O_2$ gas and the $H_2$ gas is stopped, the interior of the process chamber 201 is evacuated via the gas exhaust pipe 231. As a result, the $O_2$ gas and the $H_2$ gas remaining in the process chamber 201, an exhaust gas generated by the reaction of these gases, and the like are exhausted outward of the process chamber 201. Thereafter, the opening degree of the APC 242 is adjusted such that the internal pressure of the process chamber 201 is regulated to be the same pressure (for example, 100 Pa) as an internal pressure of a vacuum transfer chamber (in a destination (not shown) to which the wafer 200 is to be unloaded) provided adjacent to the process chamber 201.

(Substrate Unloading Step S160)

When the internal pressure of the process chamber 201 reaches a predetermined pressure, the susceptor 217 is lowered to the wafer transfer position so that the wafer 200 is supported on the wafer lifting pins 266. Then, the gate valve 244 is opened and the wafer 200 is unloaded from the process chamber 201 by a wafer transfer mechanism. In this way, the substrate process according to the present embodiment is ended.

In the present embodiment, there has been described the example in which the $O_2$ gas and the $H_2$ gas are plasma-excited to perform the plasma process on the substrate. However, the present disclosure is not limited to this example. For example, instead of the $O_2$ gas, an $N_2$ gas may be supplied into the process chamber 201, and the $N_2$ gas and the $H_2$ gas may be plasma-excited to perform a nitriding process on the substrate. In this case, it may be possible to use the processing device 100 including the above-described nitrogen-containing gas supply system in place of the above-described oxygen-containing gas supply system.

(Effects of the Present Embodiment)

The effects of the present embodiment will be described based on the results of verification conducted by the present inventors. In this verification, probes for measuring the electron density at predetermined positions inside the plasma generation space 201*a* and the substrate process space 201*b* in the substrate processing apparatus according to the present embodiment were installed at the predetermined positions to measure the distribution of the density of plasma or reactive species such as radicals or ions (hereinafter simply referred to as "plasma density") inside the plasma generation space 201*a* and the substrate process space 201*b*. Plasma generation conditions at the time of this measurement are as follows. At the time of measurement, a bare silicon wafer was mounted on the susceptor 217.

Flow rate of supplied gas: $O_2$ gas=950 sccm, $H_2$ gas=50 sccm

Internal pressure of process chamber: 150 Pa

RF frequency: 27.12 MHz

RF power: 3,500 W

Figure 6:
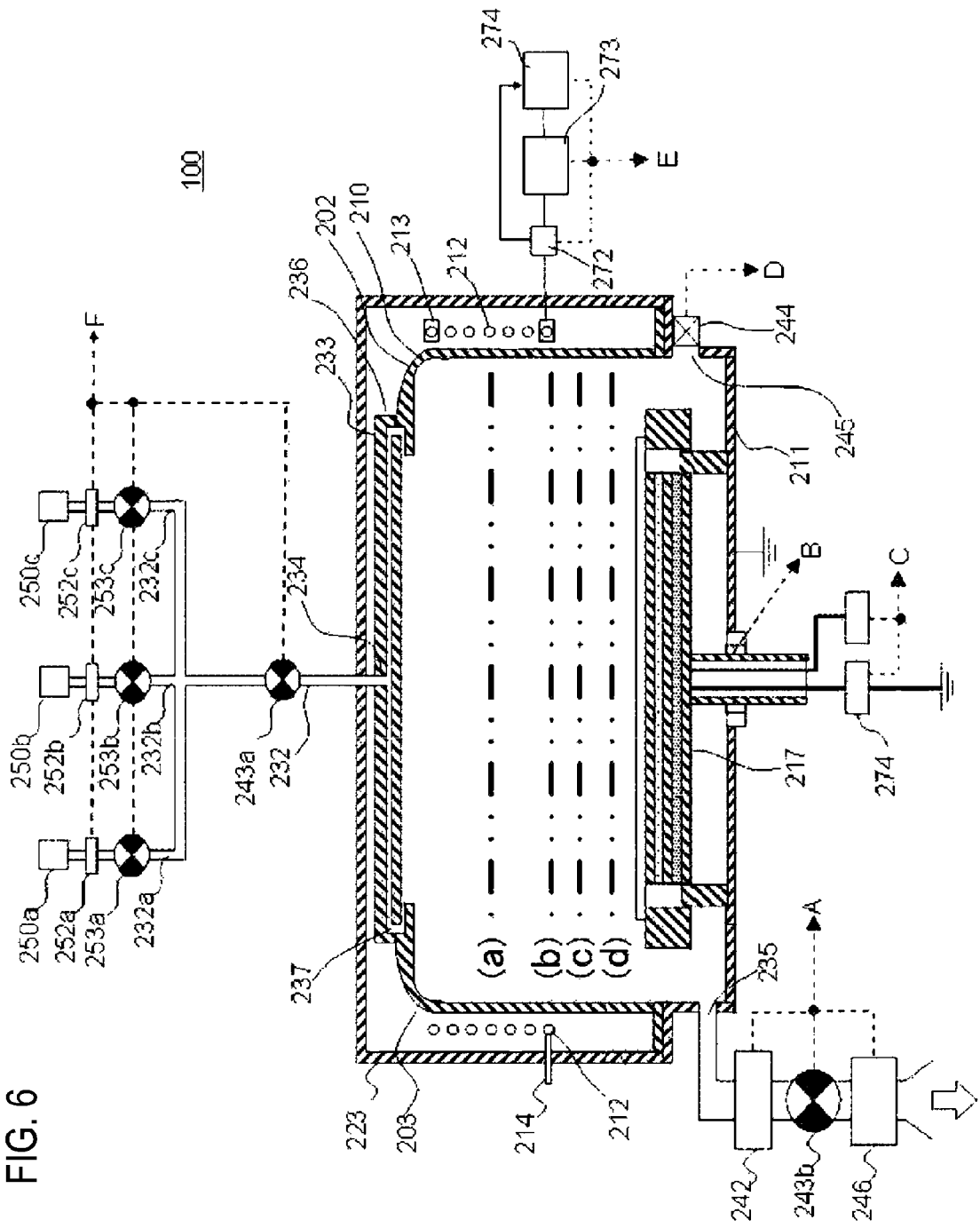
FIG. 6 is a view showing height positions of probes installed inside a plasma generation space and a substrate process space in a verification example.

FIG. 6 is a view showing height positions of the probes installed inside the plasma generation space 201*a* and the substrate process space 201*b*. In this verification, five probes were installed in each of the height positions (a) to (d) in the horizontal direction. That is to say, in this verification, the probes were installed at 20 locations in total and the distribution of the plasma density was measured.

The height position (b) is a lower end position of the resonance coil 212. Hereinafter, the height positions (a), (c) and (d) will be described using the height position (b) as a reference position (0 mm). The height position (a) is an intermediate position between the upper end and the lower end of the resonance coil 212, which is spaced apart by a distance of 100 mm upward from the lower end of the resonance coil 212. The height position (a) is a position near the electrical midpoint of the resonance coil 212 and at which the donut-like induction plasma having a highest plasma density is excited. The height position (c) is a position spaced apart by a distance of 38 mm downward from the lower end of the resonance coil 212. The height position (d) is a position spaced apart by a distance of 88 mm downward from the lower end of the resonance coil 212. In addition, the bare silicon wafer is mounted on a position spaced further apart by a distance of 50 mm downward from the height position (d).

Figure 7:
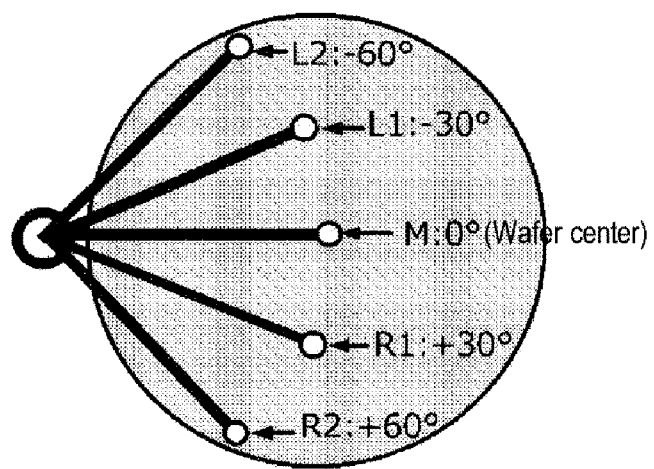
FIG. 7 is a view showing installation positions of probes at respective height positions in the verification example.

FIG. 7 is a view showing the installation positions of the probes at each of the height positions (a) to (d). The installation positions of the probes at the respective height positions are all the same. M, L1, L2, R1 and R2 in FIG. 7 indicate tip positions of the probes (measurement positions of the plasma density), respectively. M is a position corresponding to the center position of the wafer to be mounted. L1 is a position defined by moving the probe by 30 degrees to the left side from M. L2 is a position defined by moving the probe by 60 degrees to the left side from M, which corresponds to one outer edge portion of the wafer. R1 is a position defined by moving the probe by 30 degrees to the right side from M. R2 is a position defined by moving the probe by 60 degrees to the right side from M, which corresponds to another outer edge portion of the wafer. That is to say, the plasma density distribution in a wafer plane direction (horizontal direction) was measured by measuring the plasma density at M, L1, L2, R1 and R2.

Figure 9:
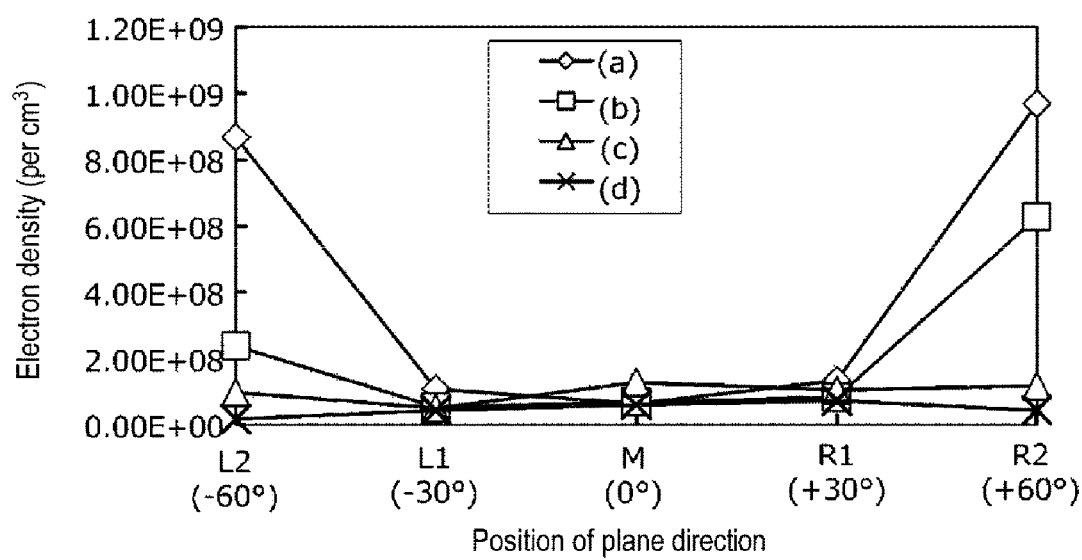
FIG. 9 is a view showing the measurement results of plasma density distributions at the height positions in the verification example.

FIG. 8 is a table showing the measurement results of the plasma density distributions at the height positions (a) to (d) under the plasma generation conditions described above. Further, FIG. 9 is a view graphically showing the values of the results shown in FIG. 8. In FIG. 9, the plasma density is represented by the number of electrons (electron density) per 1 $cm^3$. At the height position (a), donut-like induction plasma having a highest plasma density is excited. Therefore, the plasma density grows high in the vicinity of the resonance coil 212 (i.e., in the outer edge portion of the wafer), and the plasma density grows relatively low in the central portion of the resonance coil 212 in the winding direction.

In the resonance coil 212 according to the present embodiment, the donut-like induction plasma is excited even at the height position (b) which corresponds to the lower end portion of the resonance coil 212. Therefore, even at the height position (b), the plasma density grows high in the vicinity of the resonance coil 212 (i.e., in the outer edge portion of the wafer), and the plasma density tends to be relatively low in the central portion of the resonance coil 212 in the winding direction.

As described above, a deviation in the plasma density in the wafer plane direction is generated between the height positions (a) and (b), namely between the lower end portion of the resonance coil 212 and a portion above the lower end portion (that is to say, a deviation in the density of reactive species reacting with a target film formed on the wafer surface is generated). It can be noted that it is difficult to perform the plasma process on the substrate while maintaining the wafer in-plane uniformity of the plasma process at these height positions.

On the other hand, at the height positions (c) and (d), there is almost no deviation in the plasma density distribution in the wafer plane direction. That is to say, in view of the plasma density distribution at the height positions (c) and (d), it is presumed that no deviation is substantially generated in the plasma density in the wafer plane direction at at least a position below the height position (c). Therefore, in order to secure the wafer in-plane uniformity in the plasma process using the substrate processing apparatus according to the present embodiment, the wafer needs to be processed at the height position (c), namely the height position spaced apart by a distance of 38 mm or more downward from the lower end of the resonance coil 212.

As described above, when the position of the wafer in the plasma processing step is too far downward from the lower end of the resonance coil 212, radicals and ions generated by the plasma excitation may be deactivated. Because of this, the processing rate may be lower than a practical value. Therefore, the vertical position of the wafer 200 in the plasma processing step needs to be at least such a position that radicals and ions generated by the plasma-excitation are not deactivated. According to another verification using the substrate processing apparatus according to the present embodiment, it can be noted that, similar to the height positions (c) and (d), a good plasma density distribution enough to realize a practical processing rate is obtained even at the height position of the bare wafer mounted on the susceptor 217, namely the height position spaced apart by a distance of 138 mm downward from the lower end of the resonance coil 212. Accordingly, in the substrate processing apparatus according to the present embodiment, by processing the wafer at least at a position spaced apart by a distance ranging 38 to 138 mm downward from the lower end of the resonance coil 212, it is possible to realize a practical processing rate while maintaining the wafer in-plane uniformity in the plasma process.

As another verification, the present inventors also verified a case where the power value of the supplied RF power is changed in a practical range (for example, 3,000 W or 2,500 W) with respect to the conditions under which the aforementioned verification has been performed. In this case, as the power value increases, the plasma density may increase over the entire plane direction of the wafer 200, and a deviation in the plasma density in the plane direction of the wafer may also be changed. On the other hand, it was confirmed that, in the height range described above, there is no significant change in the tendency of deviation of the plasma density in the plane direction of the wafer. That is to say, in the above-described height range, it is presumed that even in the case of changing the power value of the supplied RF power, it is possible to secure the wafer in-plane uniformity in the plasma process.

Similarly, as a further verification, the present inventors have confirmed that when the internal pressure of the process chamber is changed (for example, 50 Pa) in a practical range with respect to the conditions under which the above-described verification has been performed, there is no significant change in the tendency of deviation of the plasma density in the plane direction of the wafer, while the plasma density is changed over the entire plane direction of the wafer (for example, the plasma density increases when the internal pressure is 50 Pa rather than 150 Pa). That is to say, in the above-described height range, it is presumed that the wafer in-plane uniformity in the plasma process can be secured even when the power value of the supplied RF power and the internal pressure of the process chamber are changed.

The aforementioned verification is directed to an embodiment in which the supplied gas is a mixed gas of the $O_2$ gas and the $H_2$ gas. However, according to another verification conducted by present the inventors, it was confirmed that even when a mixed gas of an $N_2$ gas and an $H_2$ gas is used, the wafer in-plane uniformity in the plasma process can be secured in the aforementioned height range.

According to another verification conducted by the present inventors, it is presumed that even if parameters such as the gas flow rate, the height width of the resonance coil, the winding pitch, the number of turns, the frequency of the supplied high-frequency power, and the like are changed in a practical range with respect to the conditions under which the above-described verification has been performed, similar verification results can be obtained with regard to the relationship between the uniformity of the plasma density and the height positions. In addition, it is considered that the relationship between the uniformity of the plasma density and the height positions depends mainly on the configuration of the plasma generation part. In the above-described embodiment, the processing gas is supplied from the gas supply head 236 installed in the upper portion of the process chamber 201. However, it is presumed that the similar verification result can be obtained even when a shape or position of the inlet port for introducing the processing gas into the process chamber is different from that in the above embodiment.

Furthermore, according to the plasma density distributions at the height positions (a) and (b) shown in FIG. 9, it can be noted that in the case of the present embodiment, in the plane direction of the wafer, no large deviation in the plasma density is generated in the range of 30 degrees to the left and right sides from the center of the wafer. That is to say, by mounting the wafer in a predetermined region sufficiently away from the resonance coil 212 to the center direction, it is also possible to secure the wafer in-plane uniformity in the plasma process. In other words, it can be achieved by setting the winding diameter of the resonance coil 212 to a predetermined size sufficiently larger than the diameter of the wafer. Alternatively, it can be also achieved by using a wafer having a predetermined diameter sufficiently smaller than the winding diameter of the resonance coil 212. For example, in the present embodiment, with respect to the resonance coil 212 having a winding diameter of 500 mm, a wafer having a diameter falling within a range of 30 degrees to the left and right sides from the center, namely a wafer having a diameter of about 127 mm or less, may be used.

However, there is a limit in increasing the winding diameter of the resonance coil 212 from the viewpoint of cost, space and the like. Furthermore, in a case where a resonance coil having a winding number smaller than a predetermined magnitude is used, it is impossible to process a larger wafer. Therefore, in order to process a wafer having a larger diameter without increasing the winding diameter of the resonance coil 212, the wafer may be processed at positions spaced apart by a predetermined distance (falling within a range of 38 to 138 mm in the present embodiment) downward from the lower end of the resonance coil 212. For example, when the resonance coil 212 having a winding diameter of 500 mm is used to process a wafer having a diameter larger than about 127 mm, the wafer may be processed at positions spaced apart by a distance of a predetermined range downward from the lower end of the resonance coil 212.

In the present embodiment, there has been described the example in which the wafer is processed at a position spaced apart by a distance falling with a range of 38 to 138 mm downward from the lower end of the resonance coil 212. However, the present disclosure is not limited to this range. The height of the susceptor 217 (substrate mounting part) may be controlled to position the wafer 200 at such a height position spaced apart downward from the lower end of the resonance coil 212 that the deviation (in-plane deviation) of the plasma density on the wafer surface in the plane direction falls within a predetermined allowable range. For example, in-plane deviations of the plasma density at a plurality of height positions with respect to the lower end position of the resonance coil 212 are acquired in advance. Then, in accordance with the allowable range of the in-plane deviation respectively set for each process on the wafer, the height of the susceptor 217 is controlled so as to locate the wafer 200 at a height position at which the in-plane deviation falls within the allowable range of the in-plane deviation. In this case, the plasma density tends to grow high as the height position comes closer to the lower end of the resonance coil 212. Therefore, from the viewpoint of improving the process speed, it is preferable that the wafer 200 is located at a position closest to the lower end of the resonance coil 212 to the extent that the in-plane deviation is within the allowable range of the in-plane deviation.

Considering that the in-plane deviation of the plasma density is changed when changing the power value of the RF power supplied to the resonance coil 212, the susceptor 217 may be controlled according to the power value of the RF power so that the height position of the wafer 200 is optimized. For example, in-plane deviations of the plasma density at a plurality of height positions with respect to the lower end of the resonance coil 212 are acquired in advance for each power value of the RF power. Then, according to the power value of the RF power thus set, the height of the susceptor 217 may be controlled so as to locate the wafer 200 at a height position at which the in-plane deviation of the plasma density is an allowable in-plane deviation. Even in this case, from the viewpoint of improving the process speed, the wafer 200 may be located at a position closest to the lower end of the resonance coil 212 to the extent that the in-plane deviation is within the allowable range of the in-plane deviation. Similarly, from the viewpoint of improving the process speed, the plasma density may be generally set to become higher. Therefore, it is preferable that the power value of the RF power is set to become the highest to the extent that the in-plane deviation is within the allowable range of the in-plane deviation.

Other Embodiments of the Present Disclosure

In the above-described embodiment, there has been described the example in which the oxidizing process or the nitriding process is performed on the surface of the substrate using plasma. However, the present disclosure is not limited to these processes and is applicable to any technique that performs a process on a substrate using plasma. For example, the present disclosure may be applied to a modifying process or a doping process on a film formed on a surface of a substrate, a reducing process of an oxide film, an etching process of the film, an ashing process of a resist, and the like, which are performed using plasma.

INDUSTRIAL USE OF THE PRESENT DISCLOSURE

According to the present disclosure, when processing a substrate by plasma-exciting a processing gas, it is possible to reduce a deviation in density of plasma generated on a surface of the substrate, thereby improving an in-plane uniformity in the substrate process.

What is claimed is:

1. A substrate processing apparatus, comprising: a substrate process chamber having a plasma generation space in which a processing gas is plasma-excited and a substrate processing space communicating with the plasma generation space; a substrate mounting table installed inside the substrate processing space and configured to mount a substrate thereon; an inductive coupling structure provided with a coil installed so as to be wound around an outer periphery of the plasma generation space; a substrate support table elevating part configured to raise or lower the substrate mounting table; a gas supply part configured to supply the processing gas to the plasma generation space; and a controller configured to control the substrate support table elevating part, based on a power value of a high-frequency power supplied to the coil, so that the substrate mounted on the substrate mounting table is positioned at a target height according to the power value of the high-frequency power and spaced apart from a lower end of the coil.

2. The apparatus of claim 1, wherein a density of plasma generated at the target height while processing the substrate is uniform in a plane direction of the substrate.

3. The apparatus of claim 1, wherein the coil has a diameter larger than a diameter of the substrate.

4. The apparatus of claim 1, wherein the plasma generation space is arranged above the lower end of the coil.

5. The apparatus of claim 1, wherein the plasma generation space is arranged between the lower end of the coil and an upper end of the coil.

6. The apparatus of claim 1, wherein a density of plasma generated at a height of the lower end of the coil has a distribution in a plane direction of the substrate where a density of the plasma generated at the height of the lower end of the coil and above an outer edge portion of the substrate is higher than a density of the plasma generated at the height of the lower end of the coil and above a central portion of the substrate.

7. The apparatus of claim 1, wherein the target height is spaced apart by a distance of 38 mm or more downward from the lower end of the coil.

8. The apparatus of claim 7, wherein the target height is spaced apart by a distance of 138 mm or less downward from the lower end of the coil.

9. The apparatus of claim 1, wherein an electrical length of the coil is an integral multiple of a wavelength of the high-frequency power supplied to the coil.

10. The apparatus of claim 3, wherein the diameter of the substrate is about 300 mm, and the diameter of the coil is 500 mm or more.

11. The apparatus of claim 9, wherein the coil has an electrical length which is one time the wavelength of the high-frequency power.

12. The apparatus of claim 1, wherein the controller is configured to control the substrate support table elevating part based on an allowable range of an in-plane deviation of a density of plasma in a plane direction of the substrate, which is set for each plasma process on the substrate mounted on the substrate mounting table.

* * * * *